United States Patent [19]
Kawai et al.

[11] Patent Number: 5,296,727
[45] Date of Patent: Mar. 22, 1994

[54] DOUBLE GATE FET AND PROCESS FOR MANUFACTURING SAME

[75] Inventors: Shinichi Kawai, Tokyo; Tetsuo Izawa, Yokohama, both of Japan

[73] Assignee: Fujitsu Limited, Kawasaki, Japan

[21] Appl. No.: 57,016

[22] Filed: May 5, 1993

Related U.S. Application Data

[63] Continuation of Ser. No. 748,923, Aug. 23, 1991, abandoned.

[30] Foreign Application Priority Data

Aug. 24, 1990 [JP] Japan .................................. 2-224100

[51] Int. Cl.⁵ ..................... H01L 29/78; H01L 21/265
[52] U.S. Cl. .................................. 257/260; 257/270;
257/347; 257/507; 357/23.14; 357/59; 437/40;
437/235; 437/911; 437/913

[58] Field of Search ................. 357/23.14, 59; 437/40, 437/235, 911, 913; 257/260, 270, 347, 507

[56] References Cited

U.S. PATENT DOCUMENTS

4,748,485 5/1988 Vasudev ............................ 357/23.14
4,929,568 5/1990 Beasom et al. ................... 357/23.14

FOREIGN PATENT DOCUMENTS

53-84485 7/1978 Japan ............................. H01L 29/78
55-146976 11/1980 Japan ............................. H01L 29/78

*Primary Examiner*—Edward Wojciechowicz
*Attorney, Agent, or Firm*—Staas & Halsey

[57] ABSTRACT

A high speed and highly functional MOSFET having a thin channel formed in a single crystalline layer is controlled by voltages applied to both an upper gate electrode and a buried gate layer that sandwich the channel therebetween.

13 Claims, 8 Drawing Sheets

DOUBLE GATE FET AND PROCESS FOR MANUFACTURING SAME

This application is a continuation of application Ser. No. 07/748,923, filed Aug. 23, 1991, now abandoned.

BACKGROUND OF THE INVENTION

1. Field of the Invention

The present invention relates to a semiconductor device and, more specifically, a high speed metal oxide semiconductor field-effect transistor (MOSFET) having a novel structure and a process for manufacturing the same.

2. Description of the Related Art

Semiconductor integrated circuits are used in various devices as high speed logic devices and high capacity memories, but research is still underway to increase the speed and lower the power consumption of semiconductor devices.

In one conventional high-speed n-channel MOSFET, formed in a thin film semiconductor layer of a semiconductor-on-insulator (SOI) structure, the speed of the MOSFET can be increased by precise control of the channel region by the gate voltage, compared with that of a MOSFET formed in a bulk semiconductor (substrate).

However, in the conventional structure, the control of the channel is not complete because the channel is controlled only by a gate electrode on an upper side.

In another conventional MOSFET, one having an XMOS structure, the channel is controlled from both sides by the upper and lower gate electrodes and so the control of channel is complete in comparison with the case of the first structure. Nevertheless, the process for forming this is difficult.

The present invention was made in view of the above problems and has as objects thereof to provide a high speed and highly functional MOSFET having a novel structure and a process for manufacturing the same.

SUMMARY OF THE INVENTION

The above objects of the present invention are attained by an FET comprising a semiconductor substrate having a surface, the semiconductor substrate having a first conductivity type; a first semiconductor layer formed on the semiconductor substrate, the first semiconductor layer comprising a channel region having the first conductivity type, and having opposite ends; a first gate of a buried doped region in the semiconductor substrate formed adjacent to the surface of the semiconductor substrate and under the channel region, the first gate having a second conductivity type opposite to the first conductivity type; a gate insulating layer on the channel region; a gate electrode formed on the gate insulating layer above the channel region opposite to the first gate; and source and drain regions formed in or on the first semiconductor layer, each in contact with said opposite ends of the channel region, the source and drain regions having the second conductivity type.

The source and drain regions may be formed either in a second semiconductor layer locally formed on the first semiconductor layer or in the first semiconductor layer.

The FET preferably further respective punch-through-preventing doped regions between the source region and the first gate and between the drain region and the first gate, the punch-through-preventing doped regions having a concentration of the first conductivity type dopant but higher than that of the first semiconductor layer.

In the FET, the first gate may be electrically connected to the gate electrode.

The above FET of the present invention may be manufactured by a process including the steps of forming a first gate of a buried doped region in a semiconductor substrate adjacent to a surface of the semiconductor substrate, the semiconductor substrate having a first conductivity type, the first gate having a second conductivity opposite to the first conductivity type; depositing a first semiconductor layer having the first conductivity type on the semiconductor substrate, the first semiconductor layer comprising a channel region; forming a mask layer locally on the channel region of the first semiconductor layer above the first gate; depositing a second semiconductor layer locally on the first semiconductor layer employing the mask layer as a mask, the second semiconductor layer having the first conductivity type, to thereby form source and drain regions in contact with the channel region; and removing the insulating layer and forming a gate insulating layer on the channel region of the first semiconductor layer and a gate electrode on the gate insulating layer above the channel region.

Alternatively, the process may include the steps of forming a first gate of a buried doped region in a semiconductor substrate adjacent to a surface of the semiconductor substrate, the semiconductor substrate having a first conductivity type and the first gate having a second conductivity opposite to the first conductivity type; depositing a first semiconductor layer having the first conductivity type on the semiconductor substrate, the first semiconductor layer comprising a channel region; forming a gate insulating layer on the first semiconductor layer; forming a gate electrode on the gate insulating layer above the channel region, and locally doping the first semiconductor layer on both sides of the channel region, using the gate electrode as a mask, to thereby form source and drain regions having the second conductivity type.

As another embodiment, the present invention also provides an FET including a semiconductor substrate; a first insulating layer on the semiconductor substrate; a first semiconductor layer formed on the first insulating layer, the first semiconductor layer including a first gate having a first conductivity type; a second semiconductor layer formed on the first semiconductor layer, the second semiconductor layer including a channel region having a second conductivity type opposite to the first conductivity type, the channel region having opposite ends; a gate insulating layer formed on the channel region; a gate electrode formed on the gate insulating layer above the channel region and opposite to the first gate; and source and drain regions formed in or on the second semiconductor layer, respectively in contact with said opposite ends of the channel region, the source and drain regions being of the first conductivity type.

In the above FET, the source and drain regions are in a third semiconductor layer locally formed on the second semiconductor layer or in the second semiconductor layer.

The FET preferably further includes respective punch-through-preventing doped regions between the source region and the first semiconductor layer and between the drain region and the first semiconductor layer, the punch-through-preventing doped regions having a concentration of the first conductivity type dopant but higher than that of the second semiconductor layer.

In the FET, the first gate may be electrically connected to the gate electrode.

This FET may be manufactured by a process including the steps of forming a first semiconductor layer on a semiconductor substrate with an insulating layer between the first semiconductor layer and a semiconductor substrate, the first semiconductor layer having a first conductivity type; forming a second semiconductor layer on the first semiconductor layer, the second semiconductor layer having a second conductivity type; forming a gate insulating layer on the second semiconductor layer; forming a gate electrode on the gate insulating layer; and locally doping surface regions in the second semiconductor layer using the gate electrode as a mask to thereby form source and drain regions having the first conductivity type.

DESCRIPTION OF THE PREFERRED EMBODIMENTS

Before describing the preferred embodiments, a more detailed explanation will be made of the conventional devices.

Figure 1:
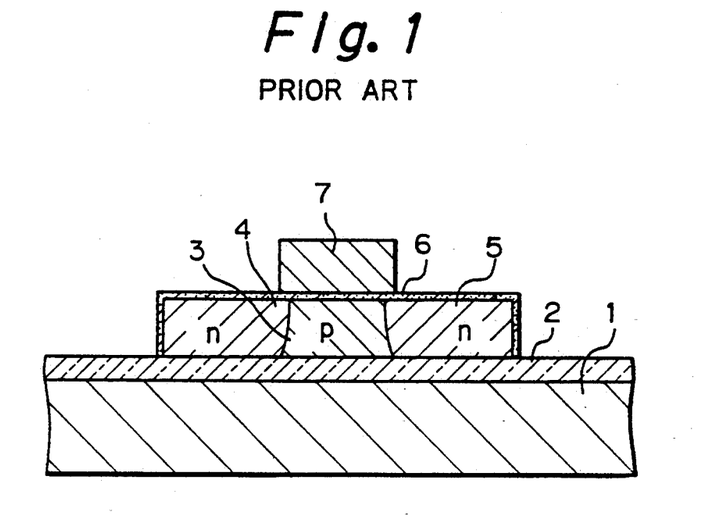
FIG. 1 is a sectional view of a first conventional MOSFET.

FIG. 1 shows a first conventional high speed n-channel MOSFET formed in a thin film semiconductor layer of an SOI structure. In FIG. 1, reference numeral 1 denotes a semiconductor substrate, 2 an insulating layer formed on the semiconductor substrate 1, 3 a p-type semiconductor layer serving as a channel region, 4 an n-type source doped region, 5 an n-type drain doped region, 6 a gate insulating layer, and 7 a gate electrode.

In this structure, since the p-type semiconductor layer 3 of the channel region is made in a thin layer, serving control of the channel region by a gate voltage is possible than in a MOSFET formed in a bulk semiconductor (substrate). The effect of a drain voltage on the channel is decreased, thereby to suppress the short channel effect, and the potential of the channel is elevated by application of a gate voltage $V_g$, so that the threshold voltage $V_{ch}$ of the MOSFET is lowered. As a result, a drain saturation voltage $V_d$ $(=V_g-V_{th})$ is elevated, and by a decrease of the charge in a depletion layer in the channel due to a thinned (i.e., reduced thinkness) layer of the channel, the effective mobility $\mu_e$ is increased, whereby the operating current is increased, to thereby speed up the MOSFET. Also, by decreasing the junction capacitance of the source and drain doped regions 4 and 5, further speeding up of the MOSFET is possible.

As mentioned before, however, in this structure, the control of the channel is not complete because the channel is controlled only by the gate electrode on the upper side.

Figure 2:
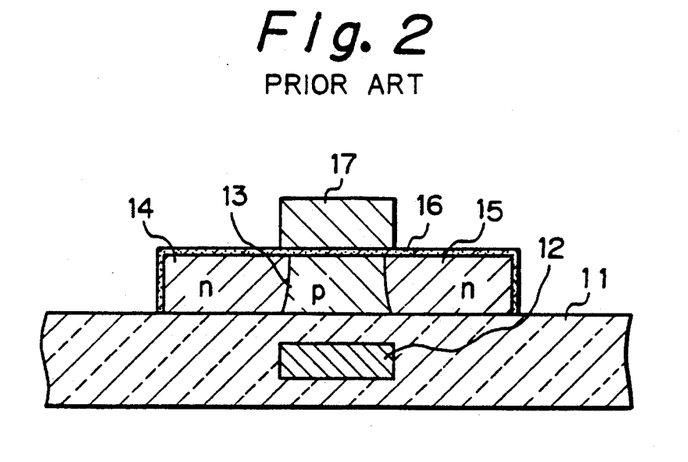
FIG. 2 is a sectional view of a second conventional MOSFET.

FIG. 2 shows a second conventional MOSFET having an XMOS structure, wherein a channel is sandwiched by an upper gate electrode and a lower gate electrode (a buried electrode). In FIG. 2, 11 denotes an insulating layer, 12 a buried electrode formed in the insulating layer 11, 13 a channel of a p-type semiconductor layer, 14 an n-type drain doped region, 16 a gate insulting layer, and 17 a gate electrode. By this MOSFET having an XMOS structure, the channel is controlled from both sides by the upper and lower gate electrodes 17 and 12 and the control of the channel is complete in comparison with the case of the first structure as shown in FIG. 1, so that the short channel effect is suppressed and a speed up of an MOSFET is made possible. This MOSFET is excellent in its functions, but the buried electrode 12 must be formed in the insulating layer 11, and the semiconductor layer 13, etc., must be formed on the insulating layer 11. Further, lamination of laminates, comprising a semiconductor layer on an insulating layer, is difficult. Particularly, uniform formation of an excellent single top semiconductor layer is extremely difficult, as mentioned before.

Figure 3A:
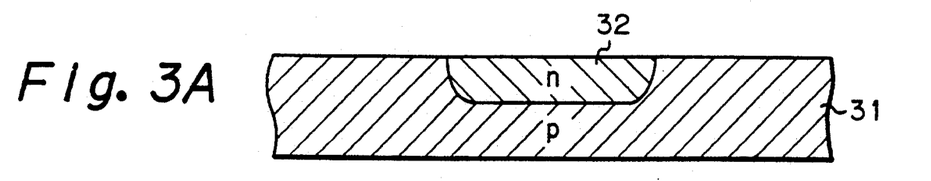
FIGS. 3A to 3K show cross-sections of structures formed by main steps of manufacturing a first MOSFET of the present invention and FIGS. 3J and 3K are cross-sectional and plan views of the thus-produced MOSFET.

Turning now to a first embodiment of the present invention, as shown in FIG. 3A, phosphorus (P) is locally implanted in a p-type silicon substrate 31 at a dose of $1\times10^{14}cm^{-2}$ to form an n-type buried region 32 having an impurity concentration of about $10^{19}cm^{-3}$.

Figure 3B:
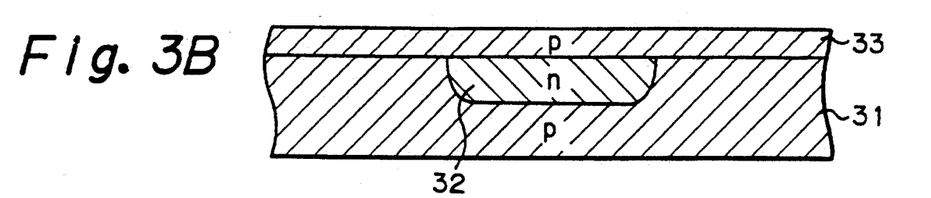

As shown in FIG. 3B, a single crystalline p-type silicon layer 33 is grown on the silicon substrate 31 by epitaxial vapor deposition. The p-type silicon layer 33 has an impurity concentration of about $10^{15}cm^{-3}$ and a thickness of 100 nm.

Figure 3C:
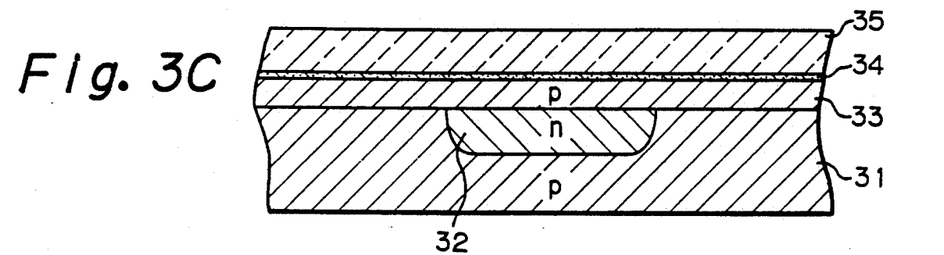

As shown in FIG. 3C, the silicon substrate 31 is heat treated to form a thermally oxidized silicon layer 34, 20 nm thick, on the entire surface of the substrate 31 and then a silicon oxide layer 35, 200 nm thick, is formed on the thermally oxidized silicon layer 34 by chemical vapor deposition (CVD).

Figure 3D:
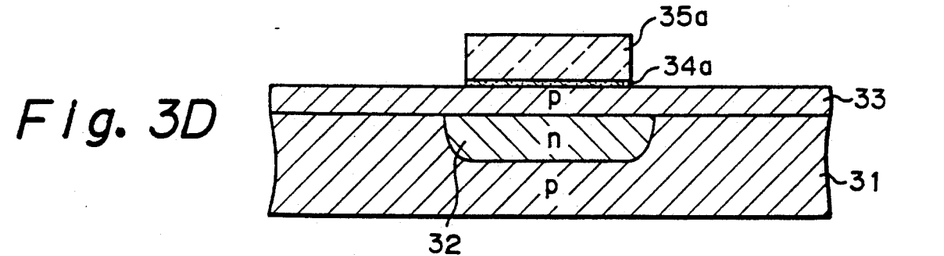

As shown in FIG. 3D, the CVD $SiO_2$ layer 35 and the thermal $SiO_2$ layer 34 are locally etched to leave only a thermal $SiO_2$ layer 34a and a CVD $SiO_2$ layer 35a.

Figure 3E:
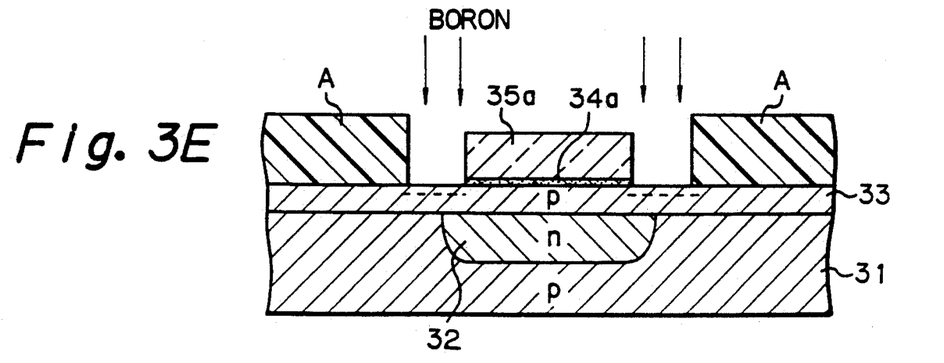
Figure 3F:
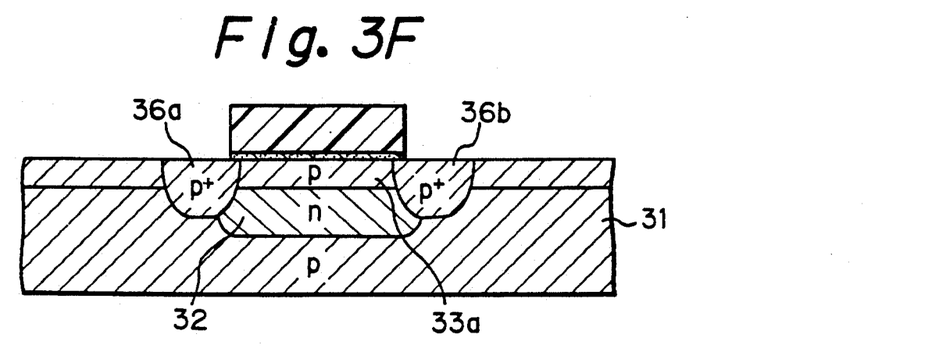

As shown in FIG. 3E, after a resist layer A is deposited and patterned, boron (B) is locally implanted at a dose of $2\times10^{13}cm^{-2}$ using the resist layer A and the CVD $SiO_2$ layer 35a as a mask, to form $p^+$-type punch through stopper layers 36a and 36b having an impurity concentration of about $10^{18}cm^{-3}$ (FIG. 3F).

Figure 3G:
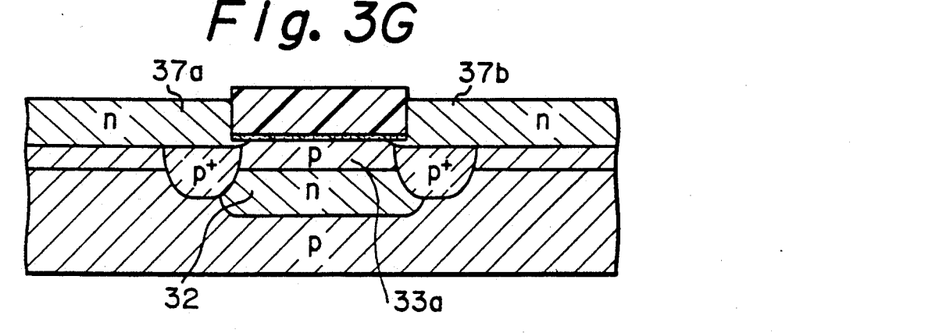

As shown in FIG. 3G, a single crystalline silicon layer, 150 nm thick, is epitaxially grown and then arsenic (As) is implanted at a dose of $2\times10^{15}cm^{-2}$ to form an n-type doped source region 37a and an n-type doped drain region 37b having an impurity concentration of about $10^{20}cm^{-3}$. The n-typed doped source region 37a and n-type doped drain region 37b are in contact with opposite ends of the p-type channel region 33a.

Figure 3H:
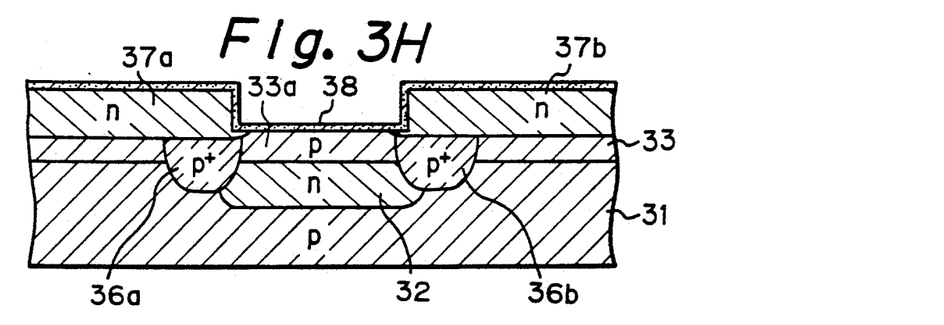

After CVD $SiO_2$ layer 35a and the thermal $SiO_2$ layer 34a are removed by a fluorine-based etching solution, a heat treatment is performed to form a gate oxide layer 38, 20 nm thick, as shown in FIG. 3H.

Figure 3I:
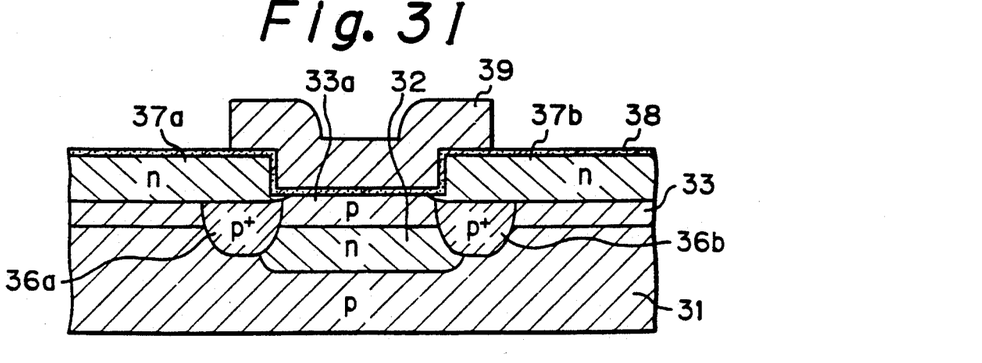

Then, a gate electrode 39 of polycrystalline silicon is formed as shown in FIG. 3I.

Figure 3J:
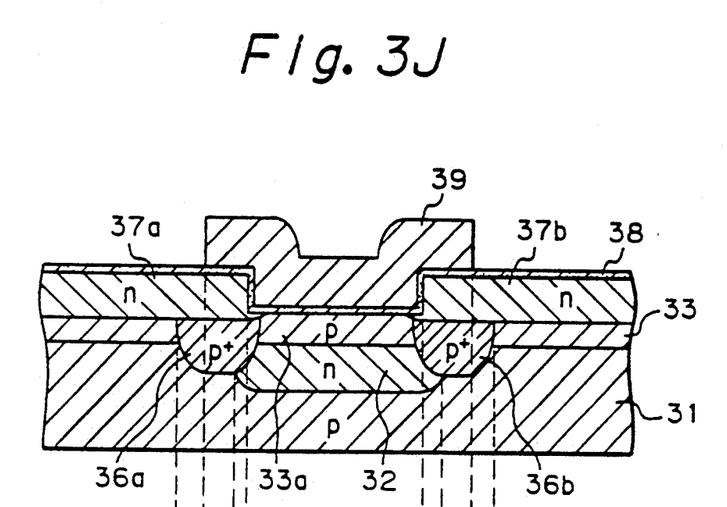
Figure 3K:
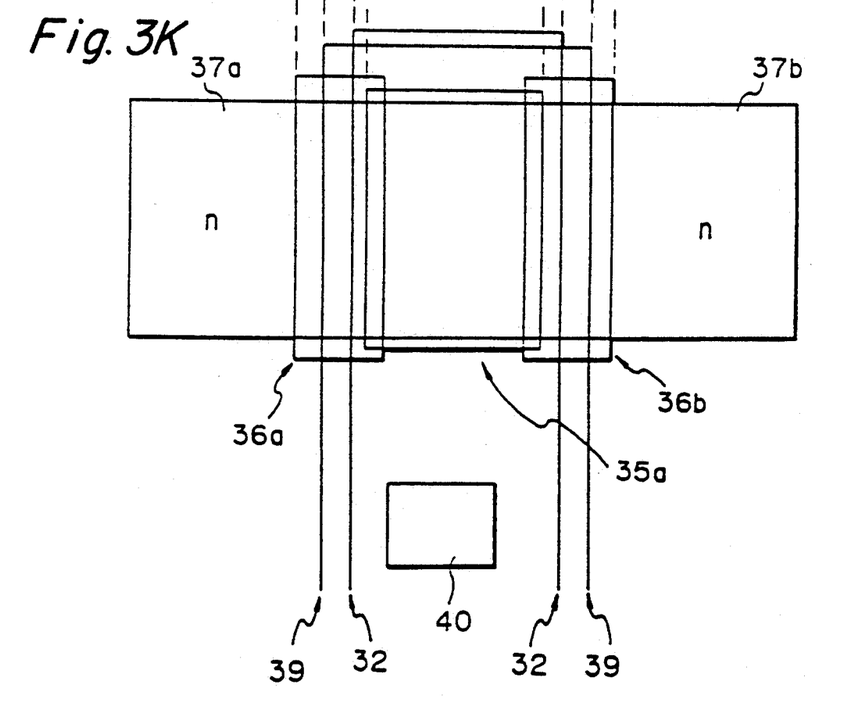

FIG. 3J (which is identical to FIG. 3I) and FIG. 3K are cross-sectional and plan views, respectively, of an example of the thus MOSFET, formed per FIG. 3A to FIG. 3I, in which the buried n-type layer 32 is electrically connected to the gate electrode 39.

In this first embodiment of an MOSFET of the present invention as shown in FIG. 3I (and FIG. 3J), since the channel 33a of a p-type thin silicon layer is controllable by both a gate voltage $V_g$ applied to the upper gate electrode 39 and a gate voltage $V_b$ applied to the lower buried layer 32, the controllability of the channel is improved in comparison with the conventional MOSFET as shown in FIG. 1 and the following advantages are obtained.

(1) When the MOSFET is operated as on-state, a positive voltage is applied to the gate electrode 39, and by simultaneously applying a positive voltage to the buried layer 32, the voltage of the total p-type silicon layer (channel region) 33a is raised. By this, a threshold voltage $V_{th}$ of the MOSFET is lowered, to increase a drain saturated voltage $V_d (= V_g - V_{th})$, and an electric field in the direction normal to the channel is reduced, to increase an effective current, so that an increase of the channel current is obtained.

(2) By applying a voltage to the channel from both the gate electrode 39 and the buried layer 32, the controllability of the channel (p-type silicon layer 33a) by a gate voltage is improved, to thereby relatively reduce an effect of a drain voltage on the channel (p-type silicon layer 33a), so that various short channel effects which prevent miniaturization of devices can be reduced.

Note that in this structure, even though a junction capacitance is increased by a buried gate layer, a speed-up of a MOSFET is obtained.

Gate voltages applied to the gate electrode 39 and the buried layer 32 may be different or the same. Further, they may be made always the same by electrically connecting the gate electrode 39 and the buried layer 32 with each other (a contact 40 between the buried layer 32 and the gate electrode 39 can be seen in FIG. 3K which is a plan view of the first MOSFET of FIG. 3J).

In the above example, punch-through stopper layers 36a and 36b are formed between the buried layer 32 and the source region 37a and between the buried layer 32 and the drain region 37b to prevent generation of a punch-through from the buried layer 32 to eight of the source or drain regions 37a and 37b; however, these layers 36a and 36b may be eliminated if the voltage applied to the buried layer 32 is not high since then a punch-through is not likely to occur.

Further, in this structure of the MOSFET, since formed in a single crystalline silicon layer 33 which is epitaxially grown on a single crystalline silicon substrate 31, a leakage current at the source or drain region or a lowering of the carrier mobility in the channel region due to deterioration of the crystallinity is prevented, and thus high speed and highly functional MOSFET's are obtainable in the entire area of the wafer.

The structure of the gate of the above embodiment may be modified as in the following. The steps as shown in FIGS. 3A and 3B are the same as those in the above example.

Figure 4A:
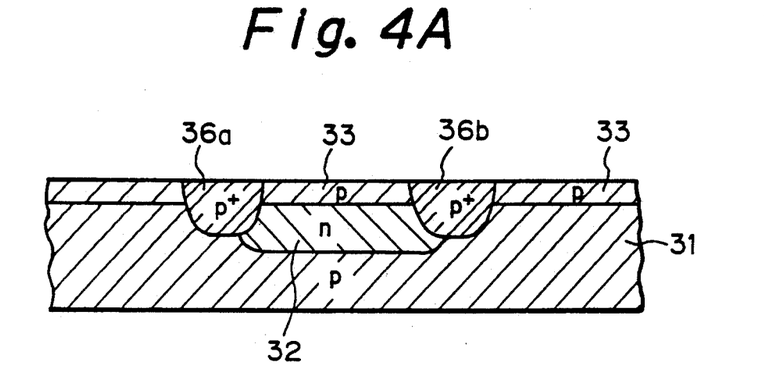
FIGS. 4A to 4E show main steps of manufacturing a modification of the first MOSFET.

As shown in FIG. 4A, p+-type punch-through stopper layers 36a and 36b having an impurity concentration of about $10^{18} cm^{-3}$ are formed extending from the p-type silicon layer 33 into the p-type silicon substrate 31, by local ion implantation of boron at a dose of $2 \times 10^{13} cm^{-2}$ employing a patterned resist (not shown) as a mask.

Figure 4B:
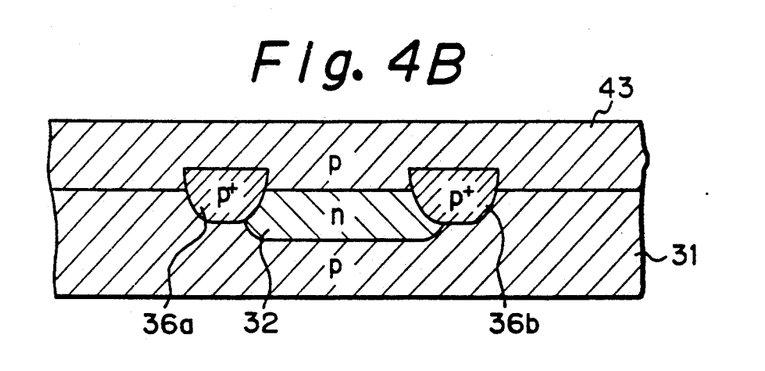

As shown in FIG. 4B, a single crystalline p-type silicon layer is epitaxially grown on the single crystalline p-type silicon layer 33 by epitaxial vapor deposition to form a single crystalline p-type silicon layer 43 having an impurity concentration of about $10^{15} cm^{-3}$.

Figure 4C:
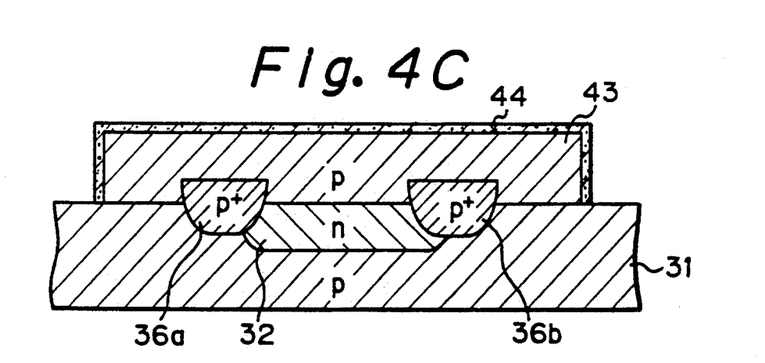

As shown in FIG. 4C, the single crystalline p-type silicon layer 43 is patterned and a heat treatment is effected to form a gate oxide layer 44 having a thickness of 20 nm.

Figure 4D:
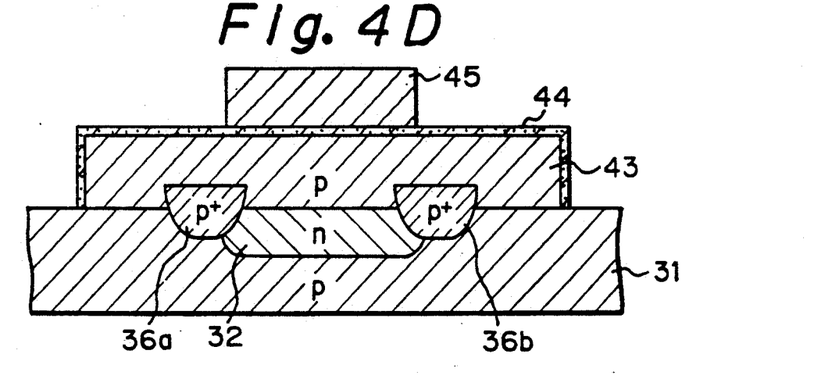

As shown in FIG. 4D, a polycrystalline silicon layer is deposited by CVD and patterned to form a gate electrode 45.

Figure 4E:
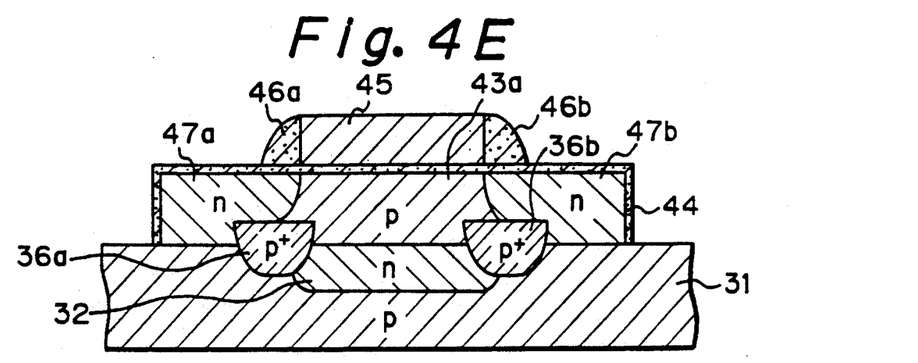

As shown in FIG. 4E, a silicon oxide layer is deposited by CVD and etched by reactive ion etching (anisotropic etching) (RIE) to leave spacers 46a and 46b on opposite ends of the gate electrode 45. As (arsenic) is locally implanted, with the gate electrode 45 and the spacers 46a and 46b as a mask, at a dose of $2 \times 10^{20} cm^{-3}$ to form an n-type source doped region 47a, an n-type drain doped region 47b, and a channel region 43a. Thus, a high speed MOSFET is manufactured.

Figure 5A:
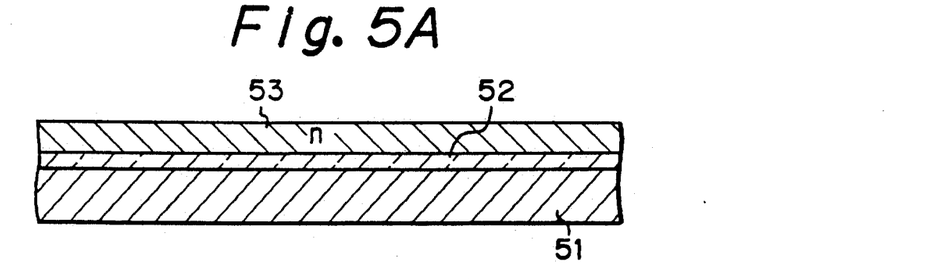
FIGS. 5A to 5G show main steps of manufacturing a second MOSFET of the present invention.

Turning to now to a second embodiment of the present invention, as shown in FIG. 5A, a structure comprising a p-type silicon substrate 51, a silicon oxide layer 52 on the substrate 51, and a single crystalline silicon layer is provided. A substrate having this structure is commercially sold as a SIMOX (Separation by IMplanted OXygen) substrate. Alternatively, a substrate having this structure may be prepared by binding a silicon substrate with an oxide layer on a surface of a silicon substrate by heat treatment, followed by polishing one of the single silicon substrates to a thin silicon layer. To the single crystalline silicon layer, P (phosphorus) is implanted to form an n-type silicon layer 53 having an impurity concentration of about $10^{19} cm^{-3}$.

Figure 5B:
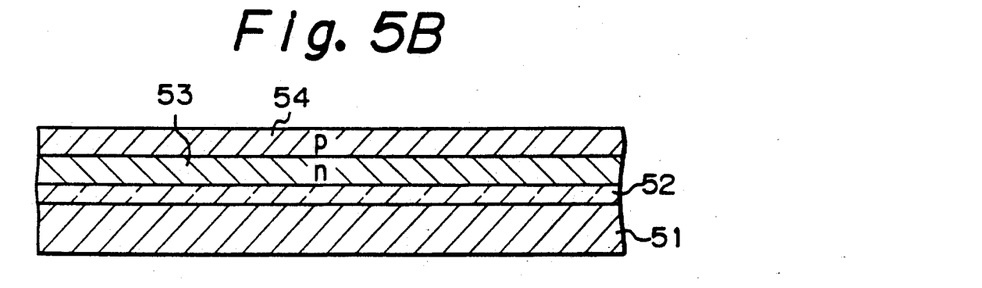

As shown in FIG. 5B, a single crystalline p-type silicon layer 54 having an impurity concentration of about $10^{15} cm^{-3}$ and a thickness of 100 nm is grown of the n-type silicon layer 53 by epitaxial vapor deposition.

Figure 5C:
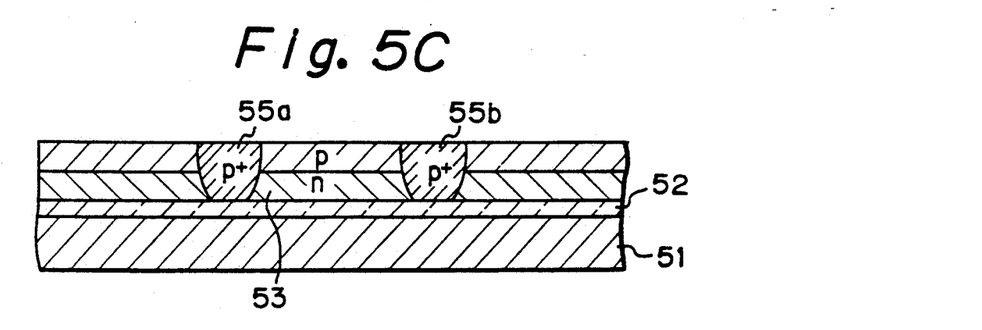

As shown in FIg. 5C, B (boron) is locally implanted at a dose of about $10^{13} cm^{-2}$ with a patterned resist (not shown) as a mask to form p+-type punch-through stopper layers 55a and 55b in the single crystalline p-type silicon layer 54 and the n-type silicon layer 53, the p+-type punch-through stopper layers 55a and 55b having an impurity concentration of $10^{18} cm^{-3}$.

Figure 5D:
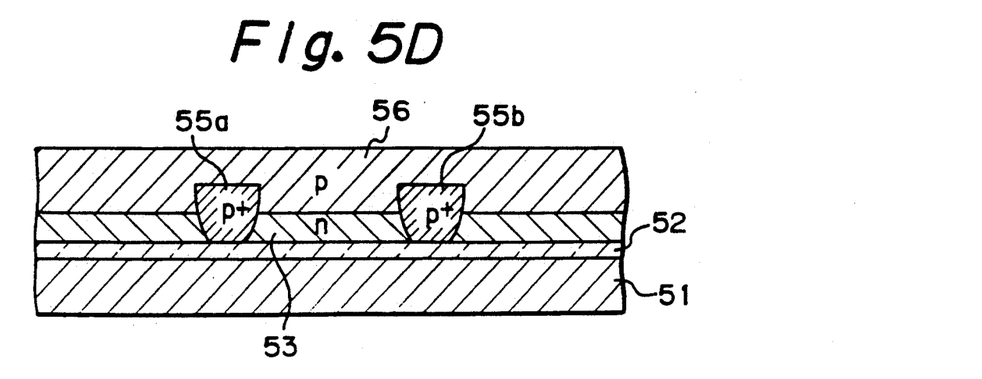

As shown in FIG. 5D, a single crystalline p-type silicon layer is epitaxially grown on the single crystalline p-type silicon layer 54 by epitaxial vapor deposition to form a single crystalline p-type silicon layer 56 having an impurity concentration of about $10^{15} cm^{-3}$.

Figure 5E:
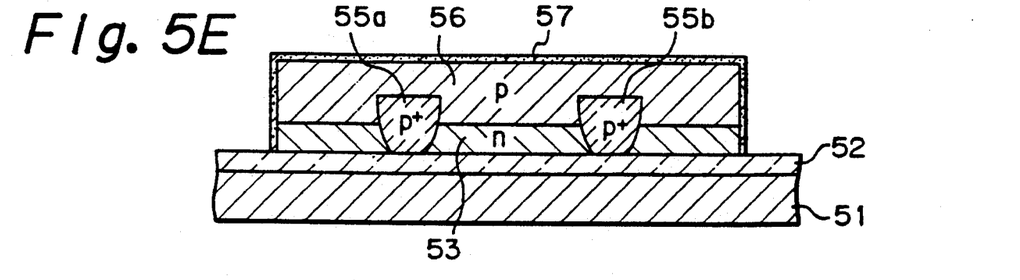

As shown in FIG. 5E, the single crystalline p-type silicon layer 56 and the n-type silicon layer 53 are patterned and a heat treatment is effected to form a gate oxide layer 57 having a thickness of 20 nm.

Figure 5F:
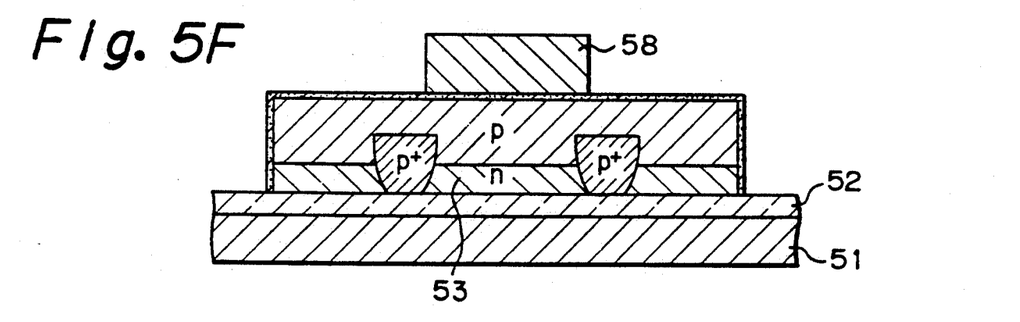

As shown in FIG. 5F, a polycrystalline silicon layer is deposited by CVD and patterned to form a gate electrode 58.

Figure 5G:
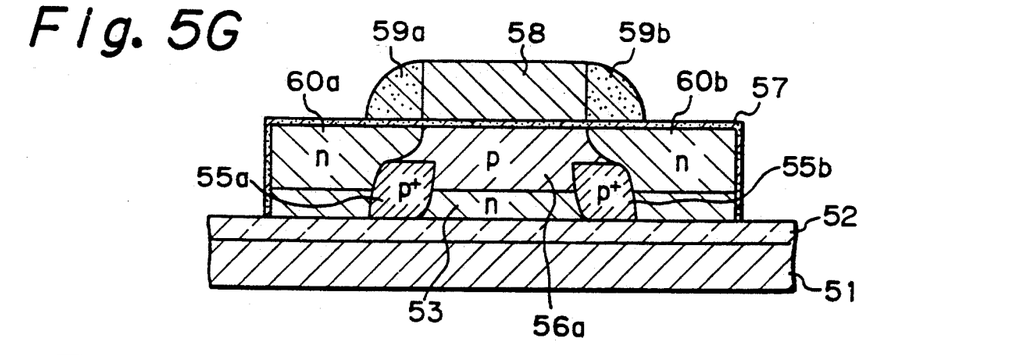

As shown in FIG. 5G, a silicon oxide layer is entirely deposited by CVD and etched by RIE to leave spacers 59a and 59b on opposite ends of the gate electrode 58. As (arsenic) is locally implanted, using the gate electrode 58 and the spacers 59a and 59b as a mask, at a dose of $2 \times 10^{15} cm^{-2}$ to form an n-type source doped region 60a and an n-type drain doped region 60b having an impurity concentration of about $10^{20} cm^{-3}$ and a channel region 56a. Thus, a high speed MOSFET is manufactured.

Thus, the second embodiment of an MOSFET of the present invention has a structure in which the thin single crystalline p-type silicon layer 56 can be controlled by not only a voltage $V_g$ applied to the upper gate electrode 58 but also a voltage $V_b$ applied to the lower n-type silicon layer 53, similar to as in the first embodiment as shown in FIG. 3I, and therefore has similar effects as in the first embodiment, i.e., (1) an increase of the drain voltage and an increase of the effective current due to a lowering of $V_{ch}$ and (2) suppression of the short channel effect.

Moreover, in the second embodiment, the junction capacitances of the n-type source doped region 60a and n-type drain doped region 60b are remarkably reduced since they are formed on the insulating layer 52, to thereby make high speed operation possible.

Further, in accordance with the process of the above embodiment, since an MOSFET is formed in a single crystalline silicon layer epitaxially grown on a p-type silicon substrate 41, leakage current at the source-drain junction due to deteriorated crystallinity is low and a lowering of the carrier mobility due to a deteriorated crystallinity is prevented, and thus high speed and highly functional MOSFET's can be made throughout a wafer.

In the embodiment, while the spacers 59a and 59b are formed on opposite sides of the gate electrode 28, the reason is to protect the punch-through stoppers 55a and 55b from the ion implantation, and therefore these spacers may be eliminated depending on conditions.

Figure 6:
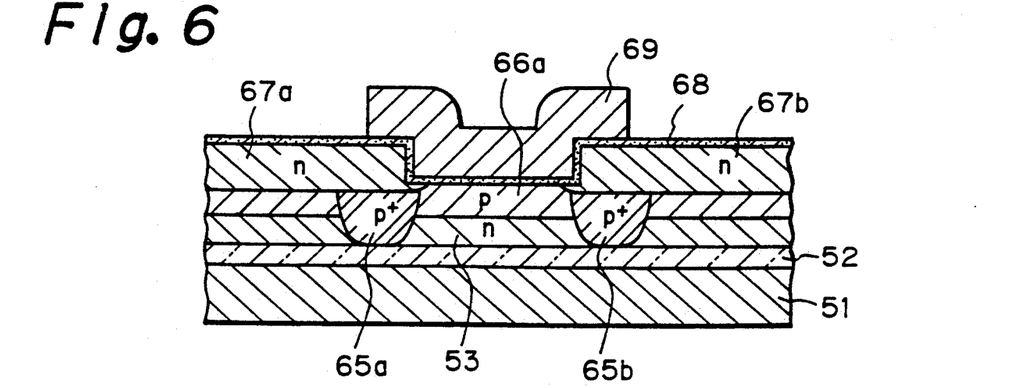
FIG. 6 is a sectional view of a modification of the second MOSFET.

Further, as shown in FIG. 6, the gate electrode may be made as a recessed-type, i.e., in the same manner as illustrated in FIGS. 3F to 3I.

Although the above embodiments are described by n-channel MOSFET's as examples, a p-channel MOSFET is also possible, of course. Accordingly, a complementary type MOS (CMOS) may be also manufactured.

We claim:

1. An FET comprising:
   a semiconductor substrate having a main surface, the semiconductor substrate being of a first conductivity type;
   a first semiconductor layer formed on the semiconductor substrate, the first semiconductor layer comprising a channel region of the first conductivity type and having opposite ends, a lower surface on the main surface of the semiconductor substrate and an upper surface;
   a first gate comprising a buried, doped region formed within the semiconductor substrate and having an upper surface at least adjacent to the main surface of the semiconductor substrate and disposed under the channel region, the first gate being of a second conductivity type opposite to the first conductivity type, the first gate and the channel region forming a pn junction;
   a gate insulating layer on the upper surface of the channel region;
   a gate electrode formed on the gate insulating layer, above the upper surface of the channel region;
   source and drain regions formed in association with the first semiconductor layer and respectively in contact with said opposite ends of the channel region, the source and drain regions being of the second conductivity type.

2. An FET according to claim 1, further comprising a second semiconductor layer locally formed on the first semiconductor layer, the source and drain regions being formed in the second semiconductor layer and accordingly on the first semiconductor layer and respectively in contact with said opposite ends of the channel region.

3. A FET according to claim 1, wherein said source and drain regions are formed in the first semiconductor layer.

4. An FET according to claim 1, further comprising punch-through-preventing doped regions, respectively between the source region and the first gate and between the drain region and the first gate, of the first conductivity type and having a dopant concentration higher than that of the first semiconductor layer.

5. An FET according to claim 1, wherein the first gate is electrically connected to the gate electrode.

6. A process for manufacturing an FET in a semiconductor substrate having a main surface, comprising the steps of:
   forming a buried doped region within the semiconductor substrate, the buried doped region having an upper surface at least adjacent to the main surface of the semiconductor substrate and comprising a first gate, the semiconductor substrate being of a first conductivity type and the first gate being of a second conductivity type opposite to the first conductivity type;
   depositing a first semiconductor layer of the first conductivity type on the main surface of the semiconductor substrate, a portion of the first semiconductor layer disposed above the first gate comprising a channel region having opposite ends, the first gate and the channel region forming a pn junction;
   forming a mask layer, localized on the channel region portion of the first semiconductor layer and thereby disposed above the first gate;
   depositing a second semiconductor layer on the first semiconductor layer, using the mask layer as a mask, the second semiconductor layer being of the second conductivity type and forming source and drain regions respectively in contact with the opposite ends of the channel region;
   removing the localized mask layer thereby to expose an upper surface of the channel region;
   forming a gate insulating layer on the exposed upper surface of the channel region; and
   forming a gate electrode on the gate insulating layer and thereby above, and insulated from, the channel region by the gate insulating layer.

7. A process for manufacturing an FET, comprising the steps of:
   forming a buried doped region within the semiconductor substrate, the buried doped region having an upper surface at least adjacent to the main surface of the semiconductor substrate and comprising a first gate, the semiconductor substrate being of a first conductivity type and the first gate being of a second conductivity type opposite to the first conductivity type;
   depositing a first semiconductor layer on the semiconductor substrate, the first semiconductor layer comprising a central portion having opposite edges and first and second end portions respectively at the opposite edges thereof and integral with the central portion, the central portion being disposed over the first gate and of the first conductivity type and comprising a channel region, the first gate and the channel region forming a pn junction;

forming a gate insulating layer on the first semiconductor layer;

forming a gate electrode on the gate insulating layer, localized above the channel region; and locally doping the first and second end portions of the first semiconductor layer with a dopant of the second conductivity type, using the gate electrode as a mask, thereby to form respective source and drain regions of the second conductivity type.

8. An FET comprising:

a semiconductor substrate;

a first insulating layer formed on the semiconductor substrate;

a first semiconductor layer formed on the first insulating layer, the first semiconductor layer comprising a first gate of a first conductivity type;

a second semiconductor layer formed on the first semiconductor layer, the second semiconductor layer comprising a central portion having opposite edges and first and second end portions respectively at the opposite edges thereof and integral with the central portion, the central portion being disposed over the first gate and of a second conductivity type opposite to the first conductivity type and comprising a channel region, the first gate and the channel region forming a pn junction;

a gate insulating layer formed on the channel region;

a gate electrode formed on the gate insulating layer, localized above the channel region; and source and drain regions formed in association with the second semiconductor layer and respectively in contact with said opposite ends of the channel region, the source and drain regions being of the first conductivity type.

9. An FET according to claim 8, further comprising a third semiconductor layer locally formed on the second semiconductor layer, the source and drain regions being formed in the third semiconductor layer and accordingly on the second semiconductor layer and respectively in contact with said opposite ends of the channel region.

10. An FET according to claim 8, wherein said source and drain regions are formed in the first semiconductor layer.

11. An FET according to claim 8, further comprising punch-through-preventing doped regions, respectively between the source region and the first semiconductor layer and between the drain region and the first semiconductor layer, of the first conductivity type and having a dopant concentration higher than that of the second semiconductor layer.

12. An FET according to claim 8, wherein the first gate is electrically connected to the gate electrode.

13. A process for manufacturing an FET in a semiconductor substrate having a main surface, comprising the steps of:

forming an insulating layer on the main surface of the substrate;

forming a first semiconductor layer on the insulating layer, the first semiconductor layer being of a first conductivity type;

forming a second semiconductor layer on the first semiconductor layer, the second semiconductor layer comprising a central portion having opposite edges and first and second end portions respectively at the opposite edges thereof and integral with the central portion, the central portion being disposed over the first gate and of a second conductivity type and comprising a channel region, the first gate and the channel region forming a pn junction;

forming a gate insulating layer on the second semiconductor layer;

forming a gate electrode on the gate insulating layer, localized above the channel region; and locally doping surface regions of the first and second end portions of the second semiconductor layer with a dopant of the first conductivity type, using the gate electrode as a mask, thereby to form respective source and drain regions of the first conductivity type.

* * * * *

UNITED STATES PATENT AND TRADEMARK OFFICE
CERTIFICATE OF CORRECTION

PATENT NO. : 5,296,727
DATED : Mar. 22, 1994
INVENTOR(S) : KAWAI et al.

It is certified that error appears in the above-indentified patent and that said Letters Patent is hereby corrected as shown below:

Col. 1, line 33, delete "the" (first occurrence);
       line 36, after "this" insert --structure--.
Col. 1, line 34, after "control" insert --the--.
Col. 2, line 56, after "regions" insert --,--.

Col. 3, line 61, change "$V_{ch}$" to --$V_{th}$--.

Col. 5, line 47, change "eight" to --either--;
       line 50, after "high" insert --,--.

\* Col. 6, line 26, delete "to" (first occurrence).

Col. 7, line 14, change "$V_{ch}$" to --$V_{th}$--.

\* Col. 8, line 10, change "A" to --An--.

Col. 10, line 4, change "first" to --second--.

Signed and Sealed this

Twenty-second Day of November, 1994

Attest:

BRUCE LEHMAN

*Attesting Officer*     *Commissioner of Patents and Trademarks*